US008288895B2

(12) United States Patent
Yoon et al.

(10) Patent No.: US 8,288,895 B2
(45) Date of Patent: Oct. 16, 2012

(54) HIGH-POWER TUNABLE CAPACITOR

(75) Inventors: Youngchang Yoon, Atlanta, GA (US);
Hyungwook Kim, Atlanta, GA (US);
Minsik Ahn, Atlanta, GA (US);
Chang-Ho Lee, Marietta, GA (US); Joy Laskar, Marietta, GA (US)

(73) Assignee: Samsung Electro-Mechanics, Gyunggi-Do (KR)

( * ) Notice: Subject to any disclaimer, the term of this patent is extended or adjusted under 35 U.S.C. 154(b) by 285 days.

(21) Appl. No.: 12/626,774

(22) Filed: Nov. 27, 2009

(65) Prior Publication Data
US 2011/0127849 A1 Jun. 2, 2011

(51) Int. Cl.
*H02M 3/06* (2006.01)
(52) U.S. Cl. ............... 307/109; 361/277; 334/11
(58) Field of Classification Search .......... None
See application file for complete search history.

(56) References Cited

U.S. PATENT DOCUMENTS

| | | | |
|---|---|---|---|
| 6,013,958 A | 1/2000 | Aytur | |
| 6,940,358 B1 | 9/2005 | Meacham | |
| 7,071,790 B2 | 7/2006 | Darabi et al. | |
| 2003/0210100 A1* | 11/2003 | Matsuo et al. | 331/101 |
| 2006/0097799 A1* | 5/2006 | Guebels | 331/46 |

FOREIGN PATENT DOCUMENTS
KR 1020060075660 A 7/2006

OTHER PUBLICATIONS

W.C. Edmund Neo, et al., "Adaptive Multi-Band Multi-Mode Power Amplifier Using Integrated Varactor-Based Tunable Matching Networks." IEEE Journal of Solid-State Circuits, vol. 41, No. 9, Sep. 2006. 2166-2176.

Francesco Carrara, et al., "A 2.4-GHz 24-dBm SOI CMOS Power Amplifier with Fully Integrated Reconfigurable Output Matching Network." IEEE Transactions on Microwave Theory and Techniques, vol. 57, No. 9, Sep. 2009. 2122-2130.

Dongjiang Qiao, et al., "An Intelligently Controlled RF Power Amplifier with a Reconfigurablt MEMS-Varactor Tuner." IEEE Transactions on Microwave Theory and Techniques, vol. 53, No. 3, Mar. 2005. 1089-1095.

Jesús de Mingo, et al., "An RF Electronically Controlled Impedance Tuning Network Design and Its Application to an Antenna Input Impedance Automatic Matching System." IEEE Transactions on Microwave Theory and Techniques, vol. 52, No. 2, Feb. 2004. 489-497.

K. Buisman, et al., "'Distortion-Free' Varactor Diode Topologies for RF Adaptivity." IEEE 2008. 157-160.

Peter and Henrik Sjoblom, An Adaptive Impedance Tuning CMOS Circuit for ISM 2.4-GHz Band. IEEE Transactions on Circuits and Systems-I: Regular Papers, vol. 52, No. 6, Jun. 2005. 1115-1124.

David Girbau, et al., "Study of Intermodulation in RF MEMS Variable Capacitors." IEEE Transactions on Microwave Theory and Techniques, vol. 54, No. 3, Mar. 2006. 1120-1130.

Office Action for Korean Application No. 1020100064959 dated Jun. 3, 2011.

Office Action issued on May 2, 2012 in Chinese Application No. 201010574347.9.

* cited by examiner

*Primary Examiner* — Rexford Barnie
*Assistant Examiner* — Justen Fauth (57) ABSTRACT

A tunable capacitor device may be provided in accordance with example embodiments of the invention. The tunable capacitor device may include a first capacitor; a second capacitor; a third capacitor, where the first, second, and third capacitors are connected in series, wherein the second capacitor is positioned between the first capacitor and the second capacitor; and at least one switch transistor, where the at least one switch transistor is connected in parallel with the second capacitor.

14 Claims, 6 Drawing Sheets

HIGH-POWER TUNABLE CAPACITOR

FIELD OF THE INVENTION

Embodiments of the invention relate generally to a tunable capacitor for communication systems.

BACKGROUND OF THE INVENTION

As more efficient communication systems have developed, a number of communication standards having different operating frequencies and modulation methods have been adopted. Because various standards imply the parallel composition of several independent signal paths, the multi standards consequently increase the size and cost of circuits. If reconfigurable circuit designs are possible, then the cost and the size of parallel circuits can decrease with the aid of those circuits. Therefore, recently, the design of adaptive radio frequency (RF) circuits has been thoroughly investigated.

RF circuits can be typically categorized into two parts, a receiver and a transmitter. Of the two, the receiver path has already been successfully implemented with tunability while the transmitter path has not. The transmitter path implementation, especially a power amplifier, is challenging due to the large signal operation that requires tunable capacitors or inductors that should maintain their performance up to high power. If these tunable components for high power application are available, then one can improve significantly the performance of the transmitter, especially power amplifier.

BRIEF SUMMARY OF THE INVENTION

Embodiments of the invention may provide for a high-power tunable capacitor, which may include a series of capacitors and at least one switch transistor connected in parallel with an inner one of the capacitors. In an ON-state condition, the capacitance value provided by the tunable capacitor may be defined by the series combination of the remaining capacitors that are not in parallel with the at least one switch transistor. On the other hand, in an OFF-state condition, the one or more capacitors that are in parallel with the at least one switch transistor may provide a middle capacitance that is a parallel combination of the parasitic capacitance of the at least one switch transistor with the one or more capacitors that are in parallel with the at least one switch transistor. Thus, the capacitance value provided by the tunable capacitor in the OFF-state may be the series combination of the middle capacitance with the remaining capacitors that are not in parallel with the at least one switch transistor. Thus, OFF-state capacitance value for the tunable capacitor can be adjusted by the middle capacitance.

It will be appreciated that a large resistor at each node/terminal of a switch transistor may be used to insure DC bias and guarantee voltage swing. Proper DC bias point can maximize the allowed voltage-swing around a turned-off switch transistor to avoid unwanted operation. By using this structure, embodiments of the invention can increase the power capability of a tunable capacitor. The power capability can be further increased by stacking switch transistors, according to an example embodiment of the invention.

According to an example embodiment of the invention, there is a tunable capacitor device. The tunable capacitor device may include a first capacitor; a second capacitor; a third capacitor, wherein the first, second, and third capacitors are connected in series, where the second capacitor is positioned between the first capacitor and the second capacitor; and at least one switch transistor, wherein the at least one switch transistor is connected in parallel with the second capacitor.

According to another example embodiment of the invention, there is another tunable capacitor device. The tunable capacitor device may include a first capacitor; at least one second capacitor; a third capacitor, wherein the first capacitor, the at least one second capacitor, and third capacitor are connected in series, where the at least one second capacitor is positioned between the first capacitor and the second capacitor; and means for switching between at least a first state and a second state to switch between at least a first total capacitance value or a second total capacitance value for the tunable capacitor device, where the means for switching is connected in parallel with the at least one second capacitor.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for a high-power tunable capacitor, which may include a series of capacitors and at least one switch transistor connected in parallel with an inner one of the capacitors. In an ON-state condition, the capacitance value provided by the tunable capacitor may be defined by the series combination of the remaining capacitors that are not in parallel with the at least one switch transistor. On the other hand, in an OFF-state condition, the one or more capacitors that are in parallel with the at least one switch transistor may provide a middle capacitance that is a parallel combination of the parasitic capacitance of the at least one switch transistor and the one or more capacitors that are in parallel with the at least one switch transistor. Thus, the capacitance value provided by the tunable capacitor in the OFF-state may be the series combination of the middle capacitance with the remaining capacitors that are not in parallel with the at least one switch transistor. A quality factor of a tunable capacitor for the ON-state may be based at least in part on a size of the at least one switch transistor. It will be appreciated that large resistor may be utilized at each node/terminal of the at least one switch transistor to insure DC bias and guarantee voltage swing. In addition, the power capability can be further increased by stacking a plurality of switch transistors. In an example embodiment of the invention, the tunable capacitor described herein may be utilized for a high power application such as a power amplifier. Likewise, the tunable capacitor described herein may be may provide for or enable one or more multiband, multi-mode operation of the RF circuitry, according to an example embodiment of the invention.

Figure 1:
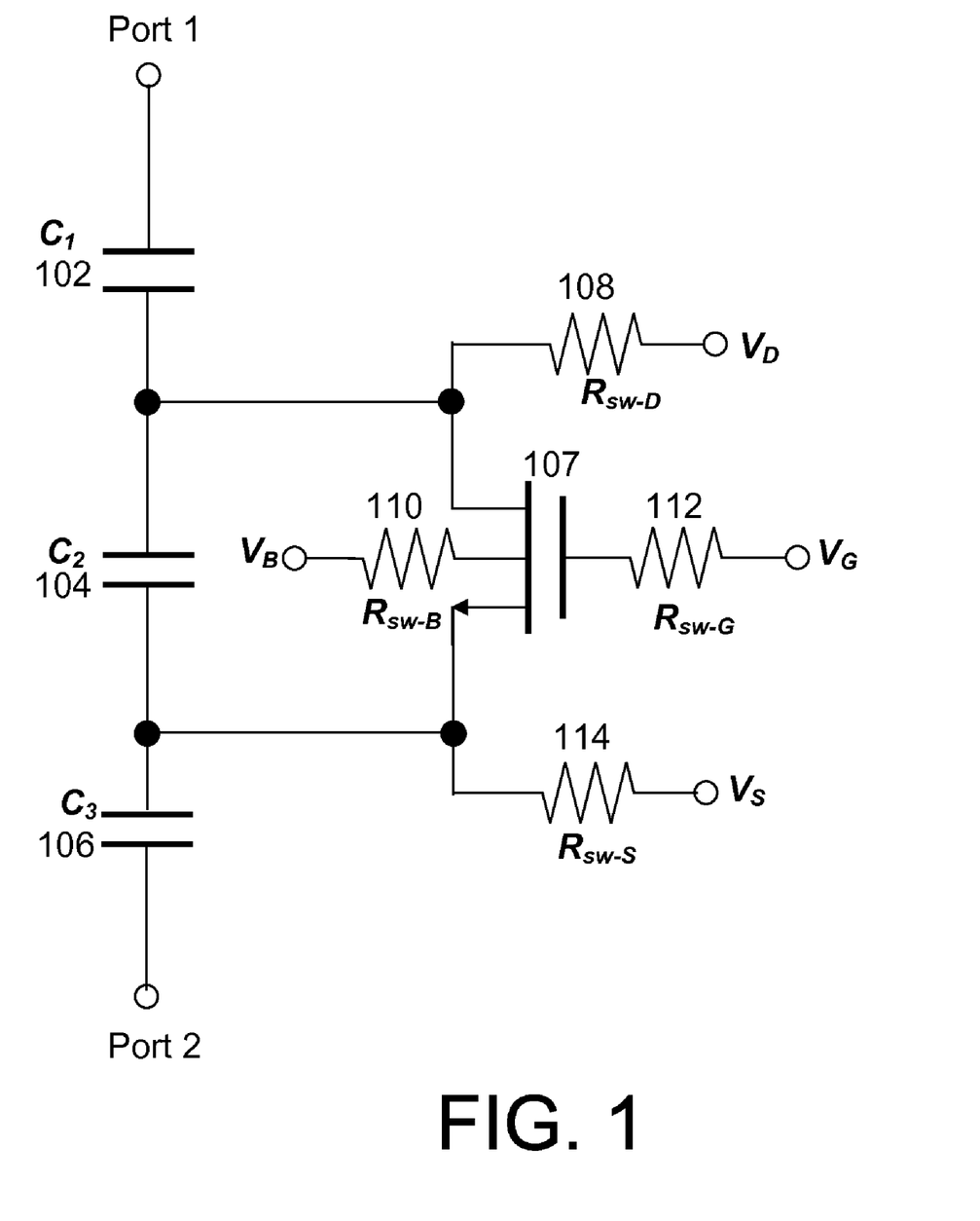
FIG. 1 is a schematic circuit diagram for a tunable capacitor according to an embodiment of the invention.

FIG. 1 illustrates an example circuit diagram of a tunable capacitor, according to an example embodiment of the invention. As shown in FIG. 1, the tunable capacitor may comprise a first capacitor (C1) 102, a second capacitor (C2) 104, and a third capacitor (C3) 106 that are connected in series. It will be appreciated that there may be more than three capacitors 102, 104, 106, according to an example embodiment of the invention. For example, the second capacitor (C2) 104 may actually comprise two or more separate capacitors that are connected in series or parallel with each other and which have an equivalent capacitance to that of the illustrated capacitor second capacitor 104. In FIG. 1, a first end of the first capacitor (C1) 102 may provide a first connection port for the tunable capacitor. A second end of the first capacitor (C1) 102 may be connected to a first end of the second capacitor (C2) 104. A second end of the second capacitor (C2) 104 may be connected to a first end of the third capacitor (C3) 106. A second end of the third capacitor (C3) 106 may provide a second connection port for the tunable capacitor.

Still referring to FIG. 1, the tunable capacitor may further comprise at least one switch transistor 107 having a plurality of terminals. The switch transistor 107 may be a field-effect transistor (FET) or another type of transistor. Where the switch transistor 107 is a FET, the transistor 107 may include a gate, drain, source, and body terminal. The gate terminal may be connected to DC bias source $V_G$ via biasing resistor 112. The drain terminal may be connected to DC bias source $V_D$ via biasing resistor 108. The source terminal may be connected to DC bias source $V_S$ via biasing resistor 114. The body terminal may be connected to DC bias source $V_B$ via biasing resistor 110. It will be appreciated that the respective resistance of resistors 108, 110, 112, 114 may be relatively large to insure DC bias and guarantee voltage swing, according to an example embodiment of the invention.

In FIG. 1, it will be appreciated that the drain terminal of switch transistor 107 may be connected to a first node between the first capacitor (C1) 102 and the second capacitor (C2) 104. On the other hand, the source of switch transistor 107 may be connected to a second node between the second capacitor (C2) 104 and the third capacitor (C3) 106. According to an example embodiment of the invention, the first, second, and third capacitors 104, 106, 108 may be integrated in a semiconductor substrate. Likewise, switch transistor 107 may likewise be integrated in the semiconductor substrate, according to an example embodiment of the invention. According to an embodiment of the invention, the tunable capacitor may be fabricated using a standard 0.18 um process, although other processes may be utilized without departing from the embodiments of the invention.

It will be appreciated that the first and second connection ports of the tunable capacitor may allow the tunable capacitor to be used in series and parallel, as well as in a differential signal path. The freedom of this usage may enable the tunable capacitor to be used in a various location of the circuit, according to an example embodiment of the invention. For example, an example tunable capacitor can be used in a series or parallel capacitor for matching network of the single-ended power amplifier. In addition, it can be also used for a tuning-out capacitor of the transformer application. In an example embodiment of the invention, the first connection port may receive input (e.g., Vin), and the second connection port may be connected to ground.

Figure 2:
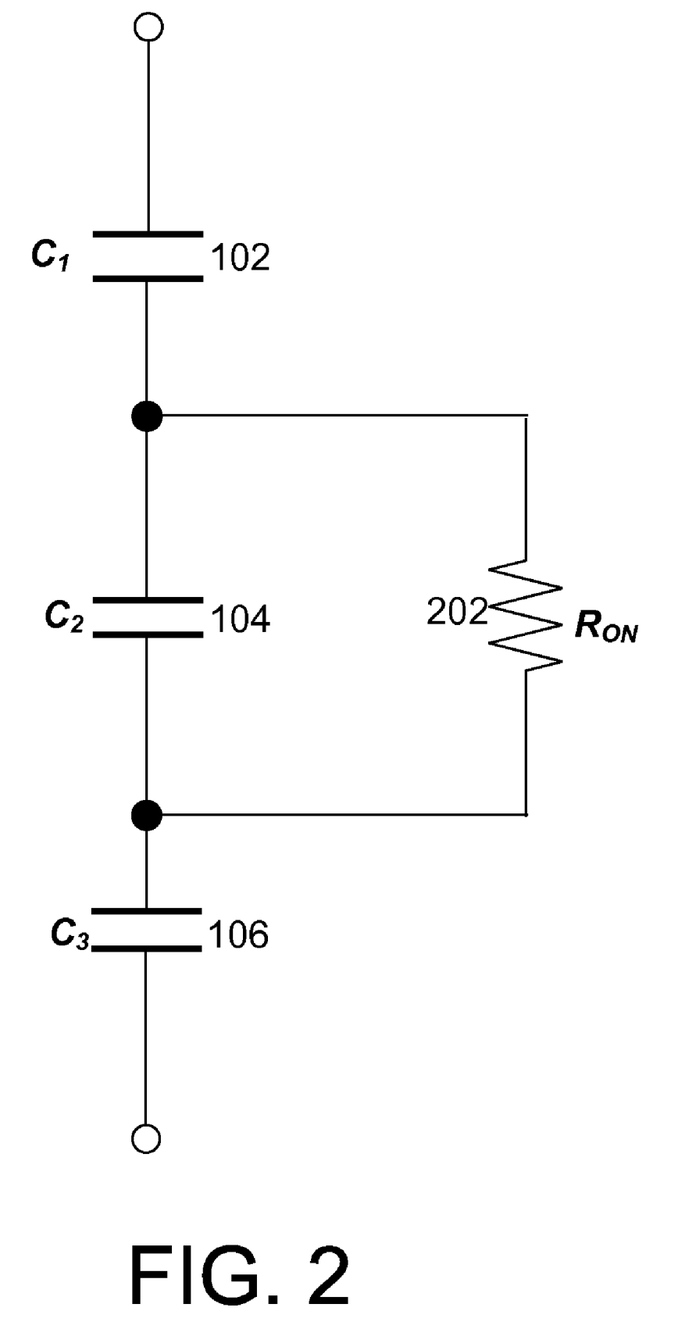
FIG. 2 illustrates an example circuit diagram for an ON-state condition of the example tunable capacitor of FIG. 1, according to an example embodiment of the invention.

FIG. 2 illustrates an example circuit diagram for an ON-state condition of the example tunable capacitor of FIG. 1, according to an example embodiment of the invention. During the ON-state condition, the switch transistor 107 may be turned ON by setting DC bias source $V_G$ to the supply voltage VDD while DC bias sources $V_D$, $V_B$, and $V_S$ are set to ground (GND). It will be appreciated that the resistances $R_{SW}$ for biasing resistors 108, 110, 112, 114 may be set to a large value to avoid signal loss through the respective resistors.

As shown in FIG. 2, when the switch transistor 107 is turned ON, the switch transistor 107 may provide an ON-state resistance ($R_{ON}$) 202. Thus, when the tunable capacitor is in an ON-state condition, the total capacitance value ($C_{ON}$) and the quality factor ($Q_{ON}$) of the tunable capacitor is given as follows:

$$C_{ON} = \frac{C_1 \cdot C_3}{C_1 + C_3} \text{ and}$$

$$Q_{ON} = \frac{1}{\omega \cdot C_{ON} \cdot R_{ON}}.$$

It will be appreciated that On-state resistance ($R_{ON}$) 202 may be set to be less than a certain value to ensure a minimum desired ON-state quality factor ($Q_{ON}$) value. Since ON-state resistance ($R_{ON}$) 202 may be inversely proportional to the width of the switch transistor 107, the switch transistor 107 may have a minimum size of width to secure the minimum desired ON-state quality factor ($Q_{ON}$) value. In an example embodiment of the invention, when the switch transistor 107 is ON, the voltage swings across the switch transistor 107 may be so small that the ON-state operation does not have an effect on the power handling capability of the tunable capacitor.

Figure 3:
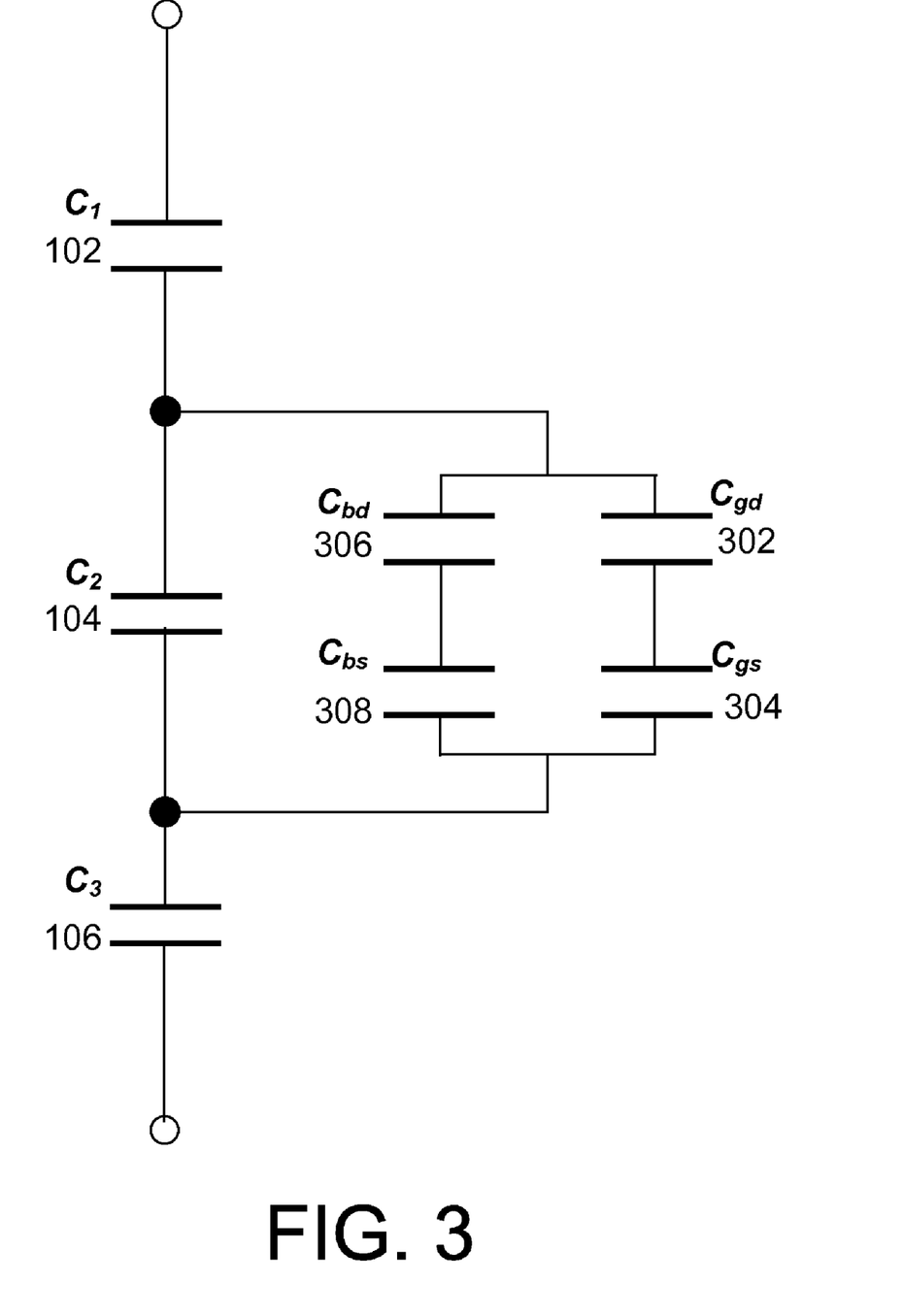
FIG. 3 illustrates an example circuit diagram for an OFF-state condition of the example tunable capacitor of FIG. 1, according to an example embodiment of the invention.

FIG. 3 illustrates an example circuit diagram for an OFF-state condition of the example tunable capacitor of FIG. 1, according to an example embodiment of the invention. During the OFF-state condition, the switch transistor 107 may be turned OFF by setting DC bias sources $V_B$ and $V_G$ to ground (GND) while DC bias sources $V_D$ and $V_S$ are set to supply voltage VDD. It will be appreciated that the resistances $R_{SW}$ for biasing resistors 108, 110, 112, 114 may be set to a large value to avoid signal loss through the respective resistors.

As shown in FIG. 3, when the switch transistor is turned OFF, the switch transistor 107 may provide a plurality of parasitic capacitances 302, 304, 306, 308. In particular, the transistor 107 may provide a parasitic gate-to-drain capacitance ($C_{gd}$) 302, a parasitic gate-to-source capacitance ($C_{gs}$) 304, a parasitic body-to-drain capacitance ($C_{bd}$) 306, and a parasitic body-to-source capacitance ($C_{bd}$) 308. As shown in FIG. 3, parasitic capacitances 302, 304 (in the gate path) may be parallel to parasitic capacitances 306, 308 (in the body path). The respective parasitic capacitances through the gate path ($C_{par\_g}$) and the body path ($C_{par\_b}$) may be defined as:

$$C_{par\_g} = \frac{C_{gd} \cdot C_{gs}}{C_{gd} + C_{gs}} \text{ and } C_{par\_b} = \frac{C_{bd} \cdot C_{bs}}{C_{bd} + C_{bs}}.$$

Accordingly, the equivalent capacitance of the switch transistor 107 in the OFF-state condition may be the series combination of the gate-path parasitic capacitance $C_{par\_g}$ and the body-path parasitic capacitance $C_{par\_b}$. Therefore, the total capacitance ($C_{OFF}$) of the tunable capacitor in the OFF-state may be considered as the series of three capacitors—the first capacitor (C1) 104, the third capacitor (C3) 106, and a third capacitance $C'_2$, where $C'_2$ is the parallel combination of the second capacitor (C2) 104 and the parasitic capacitance of the switch transistor ($C_{par\_g} + C_{par\_b}$) provided by: $C'_2 = C_2 + C_{par\_b} + C_{par\_g}$. Accordingly, the total capacitance ($C_{OFF}$) of the tunable capacitor in the OFF-state may be derived as follows:

$$C_{OFF} = \frac{C_1 \cdot C'_2 \cdot C_3}{C_1 + C'_2 + C_3}.$$

Since there may not be much resistance components in the signal path with a turned-off switch 107, the quality factor of the OFF-state tunable capacitor may be much higher compared to ON-state tunable capacitor, according to an example embodiment of the invention. It will be appreciated that when the switch transistor 107 is OFF, a potential for non-linear operation has the potential for occurring when large voltage swings are applied to the switch transistor 107. Accordingly, when the applied signal becomes substantial, it may be important to maintain the OFF-state of the switch transistor 107. To maintain the OFF-state, the applied signal may be evenly distributed across the switch transistor 107 terminals to allow the switch transistor 107 to accept the voltage swing up to its limitation without turning ON. It will be appreciated that an even distribution can be obtained by using large resistance and proper biasing as mentioned above. In addition, it will be appreciated that the source terminal of the switch transistor 107 is not at a fixed voltage potential (e.g., ground). Thus, during an OFF-state condition for the tunable capacitor, the voltage experienced by the source terminal of the switch transistor 107 may increase in response to large voltage swings at the input (e.g., the first connection port), thereby reducing the possibility that the switch transistor 107 will inadvertently turn on.

Figure 4:
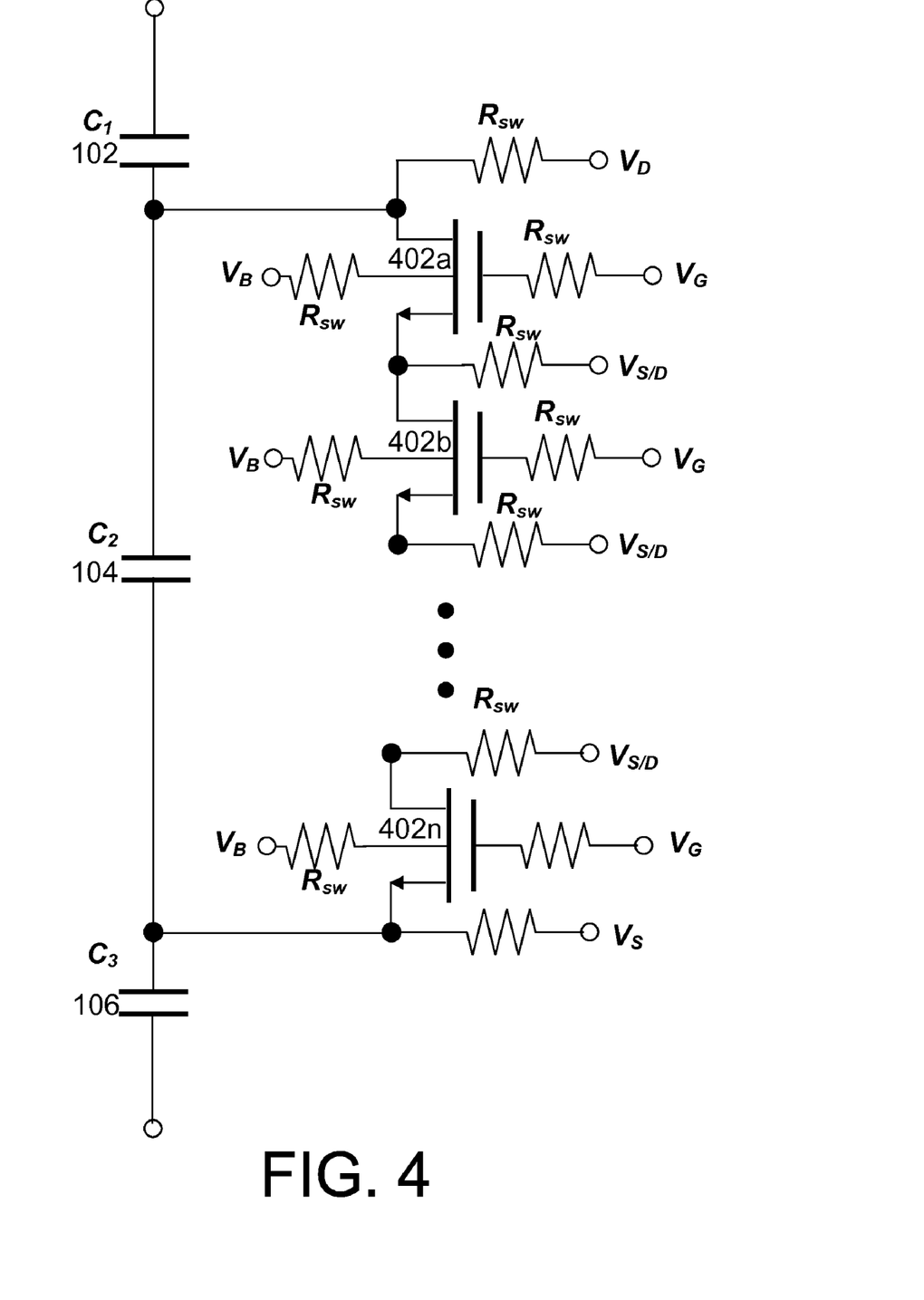
FIG. 4 shows an alternative circuit illustrating stacked switch transistors for a high-power operation in accordance with an embodiment of the invention.

FIG. 4 shows an alternative circuit illustrating stacked switch transistors for a high-power operation in accordance with an embodiment of the invention. More specifically, the switch transistor 107 of FIG. 1 may be replaced with a plurality of switch transistors 402a-n that are in a stacked configuration. As shown in FIG. 4, the stacked configuration may be obtained by connecting the drain terminal of switch transistor 402a to a first node between the first capacitor (C1) 102 and the second capacitor (C2) 104. The source terminal of switch transistor 402a may be connected to the drain terminal of switch transistor 402b. The source of transistor 402b may be connected to additional switch transistors in a source-to-drain stacked configuration until the last switch transistor 402n is reached. The source of switch transistor 402n is connected to a second node between the second capacitor (C2) 104 and the third capacitor (C3) 106. Each of the respective gate, drain, source, and body terminals of the respective stacked switch transistors 402a-n may be connected to respective DC bias sources $V_G$, $V_D$, $V_S$, $V_B$ via respective biasing resistors. It will be appreciated that the stacked transistors 402a-n may be utilized when the applied signal to the tunable capacitor is too large for any single switch transistor. Indeed, if the applied signal is too large for a single switch transistor, then the desired capacitance values may not be achieved and unwanted signal distortion may result from a high power input signal. Thus, the power capability of a tunable capacitor can be increased by stacking switch transistors 402a-n, according to an example embodiment of the invention.

Figure 5:
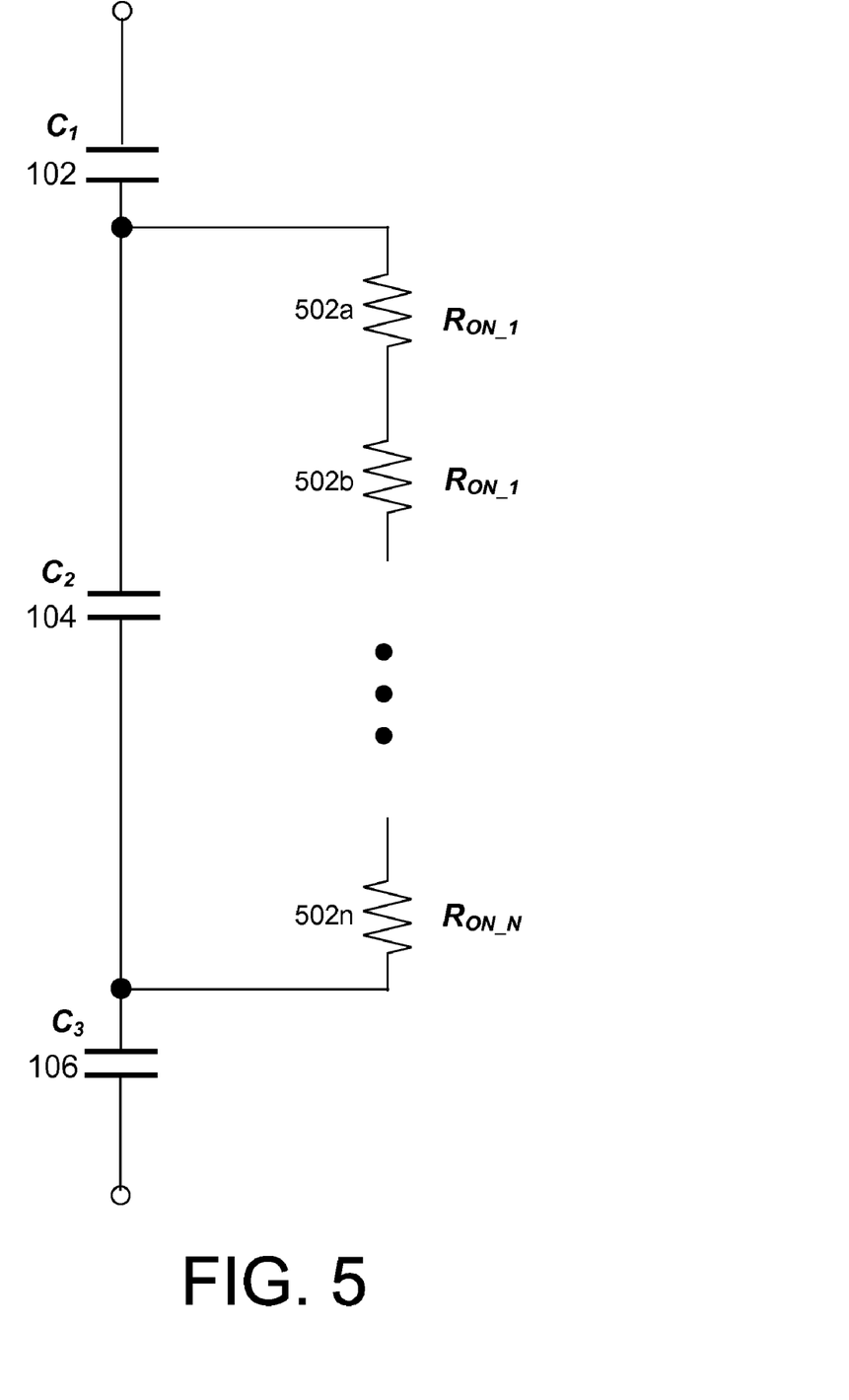
FIG. 5 shows an ON-state circuit diagram for the example tunable capacitor illustrated in FIG. 4 according to an embodiment of the invention.

FIG. 5 shows an ON-state circuit diagram for the example tunable capacitor illustrated in FIG. 4 according to an embodiment of the invention. During the ON-state, the respective terminals of the stacked transistors 402a-n may be biased as similarly described with respect to FIG. 2. It will be appreciated that the ON-state capacitance value ($C_{ON}$) and the quality factor ($Q_{ON}$) of the tunable capacitor is same with case of FIG. 2 except for how the total ON-state resistance ($R_{ON}$) is defined. In this case, the total ON-state resistance ($R_{ON}$) is the sum of all of the individual on-resistances 502a-n corresponding to $R_{ON\_1} \ldots R_{ON\_N}$ for each switch transistor 402a-n. For the same Q value with FIG. 1, the width of each switch transistor 402a-n should be increased as proportional to the number of stacked switches 402a-n to decrease total series resistance.

Figure 6:
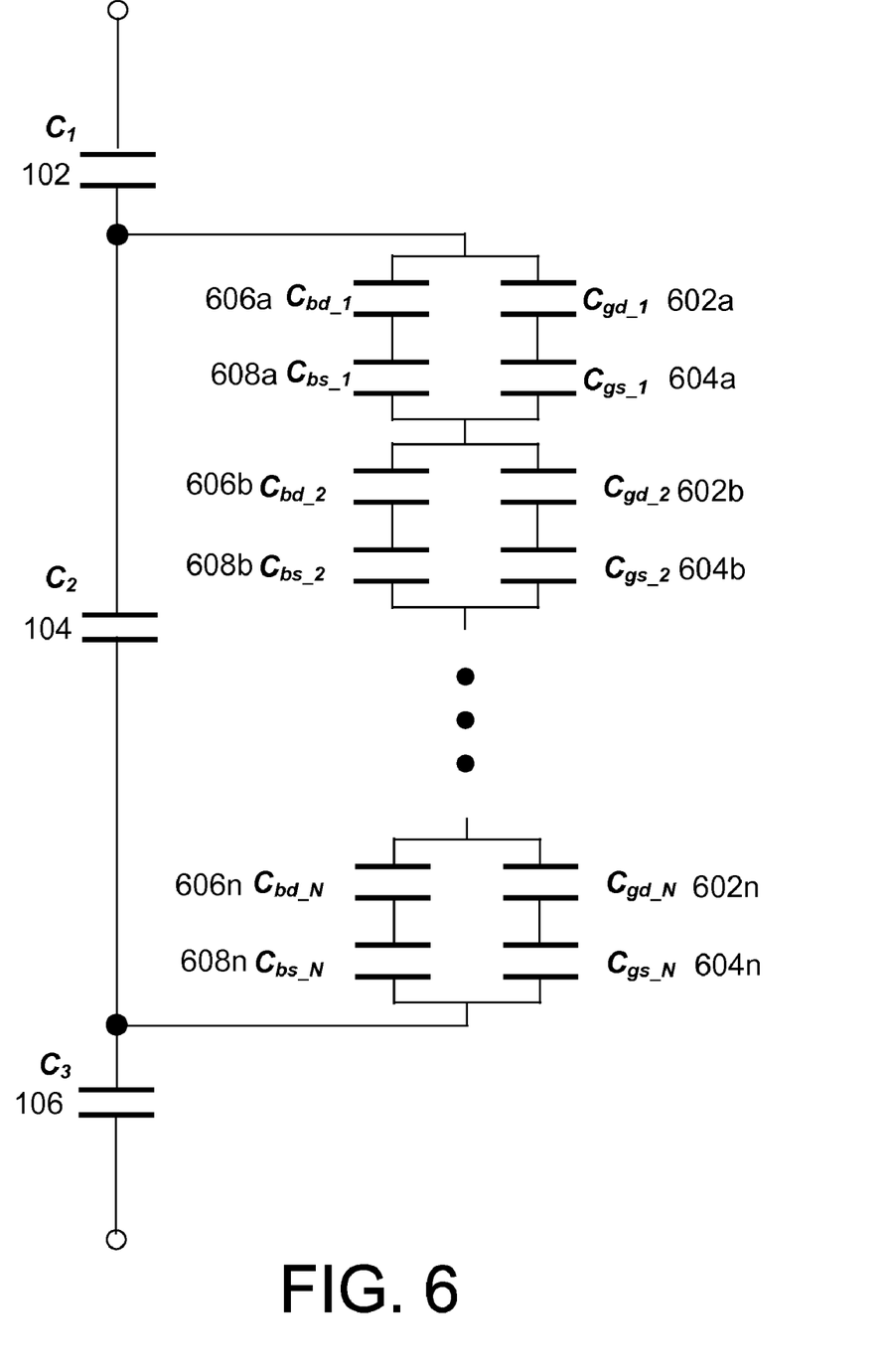
FIG. 6 shows an OFF-state circuit diagram for the example tunable capacitor illustrated in FIG. 4 according to an embodiment of the invention.

FIG. 6 shows an OFF-state circuit diagram for the example tunable capacitor illustrated in FIG. 4 according to an embodiment of the invention. During the ON-state, the respective terminals of the stacked transistors 402a-n may be biased as similarly described with respect to FIG. 3. In FIG. 6, the total capacitance ($C_{OFF}$) of the tunable capacitor in the OFF-state may be similar to that described in FIG. 3, except for how the parasitic capacitances of the stacked transistors 402a-n are determined. In particular, the parasitic capacitances of each switch transistor 402a-n may be provided by a sum of gate-path parasitic capacitance $C_{par\_g}$ (e.g., 602b+604b) and the body-path parasitic capacitance $C_{par\_b}$ (e.g., 606b+608b), as similarly described above for a single switch transistor. The total parasitic capacitance ($C_{par\_total}$) for all the switch transistors 402a-n may be determined based upon the series combination of the parasitic capacitance for each switch transistor 402a-n. Thus, the total capacitance ($C_{OFF}$) of the tunable capacitor in the OFF-state may be derived as follows:

$$C_{OFF} = \frac{C_1 \cdot C'_2 \cdot C_3}{C_1 + C'_2 + C_3},$$

where $C'_2 = C_2 + C_{par\_total}$. In comparison to FIG. 3, the use of the stacked switch transistors 402a-n may allow the tunable capacitor to operate up to a higher power signal because the applied signal may be evenly distributed across the stacked transistors 402a-n.

It will be appreciated that the tunable capacitor described herein may be fabricated using a standard 0.18 um process, although other processes may be utilized without departing from the embodiments of the invention. Thus, the first, second, and third capacitors described herein may be integrated in a semiconductor substrate along with the one or more switch transistors.

It will also be appreciated in an example embodiments of the invention, other means for switching may be utilized instead of switch transistors that are implemented using FETs. Indeed, these alternate means for switching may simply have different ON-state and OFF-state characteristics in terms of resistance and/or capacitance. In this way, a first total capacitance may be obtained in an ON-state that is different than a second total capacitance in an OFF-state. Example means for switching that may be utilized instead of switch transistors implemented using FETs, including switch transistors implemented using bipolar junction transistors (BJTs), along with nanotechnology based switches. Many variations of means for switching are available without departing from example embodiments of the invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

The invention claimed is:

1. A tunable capacitor device, comprising:
   a first capacitor;
   a second capacitor;
   a third capacitor, wherein the first, second, and third capacitors are connected in series, wherein the second capacitor is positioned between the first capacitor and the third capacitor; and
   at least one switch transistor, wherein the at least one switch transistor is connected in parallel with the second capacitor, and wherein during an ON state of the at least one transistor, the tunable capacitor device provides a first total capacitance defined by a series combination of only the first capacitor and the third capacitor, and further wherein during an OFF state of the at least one transistor, the tunable capacitor device provides a second total capacitance defined by a series combination of the first capacitor, the third capacitor, and an equivalent capacitance, wherein the equivalent capacitance is a parallel combination of the second capacitor and a parasitic capacitance of the at least one switch transistor.

2. The tunable capacitor device of claim 1, wherein respective terminals of the at least one switch transistor are connected to a respective DC bias source via respective resistors.

3. The tunable capacitor device of claim 1, wherein the at least one switch transistor comprises a plurality of switch transistors that are stacked together.

4. The tunable capacitor device of claim 3, wherein the plurality of switch transistors includes at least a first switch transistor and a second switch transistor having respective source and drain terminals, wherein the first and second switch transistors are stacked by connecting the source terminal of the first switch transistor to the drain terminal of the second switch transistor.

5. The tunable capacitor device of claim 3, wherein respective terminals of the plurality of switch transistors are connected to a respective DC bias source via respective resistors.

6. The tunable capacitor device of claim 3, wherein the plurality of switch transistors are stacked to increase a power handling capability of the tunable device.

7. The tunable capacitor device of claim 6, wherein the plurality of switch transistors are stacked to reduce voltage stress across at least the second capacitor.

8. The tunable capacitor device of claim 1, wherein the first capacitor includes a first end and a second end, wherein the third capacitor includes a third end and a fourth end, wherein the first end of the first capacitor provides a first connection port, wherein the second end of the first capacitor is connected to the second capacitor, wherein the third end of the third capacitor is connected to the second capacitor, wherein the fourth end of the third capacitor provides a second connection port.

9. The tunable capacitor device of claim 8, wherein the first connection port receives an applied input signal, and wherein the second connection port is connected to ground.

10. The tunable capacitor device of claim 1, wherein the first, second, and third capacitors are integrated in a semiconductor substrate.

11. The tunable capacitor device of claim 10, wherein the at least one switch transistor is further integrated in the semiconductor substrate.

12. The tunable capacitor device of claim 1,
    wherein the at least one switch transistor includes one or more gate terminals, one or more drain terminals, one or more source terminals, and one or more body terminals;
    wherein during an ON state, the one or more gate terminals are connected to a DC supply voltage VDD via respective biasing resistors, and the one or more drain, source, and body terminals are connected to ground; and
    wherein during an OFF state, the one or more drain and source terminals are connected to the DC supply voltage VDD via respective biasing resistors, and the one or more gate and body terminals are connected to ground.

13. The tunable capacitor device of claim 12, wherein the at least one switch transistor comprises at least one field-effect transistors (FET).

14. The tunable capacitor device of claim 1, wherein the parasitic capacitance of the at least one switch transistor comprises a combination of at least one gate path parasitic capacitance and at least one body path parasitic capacitance.

* * * * *